United States Patent [19]

Javan

[11] E Re. 29,578

[45] Reissued *Mar. 14, 1978

[54] ELECTRON TUNNELING DEVICE

[75] Inventor: Ali Javan, Cambridge, Mass.

[73] Assignee: Massachusetts Institute of Technology, Cambridge, Mass.

[*] Notice: The portion of the term of this patent sequent to Aug. 5, 1992, has been disclaimed.

[21] Appl. No.: 795,189

[22] Filed: May 9, 1977

Related U.S. Patent Documents

Reissue of:

[64] Patent No.: 3,947,681
Issued: Mar. 30, 1976
Appl. No.: 478,236
Filed: Jun. 11, 1974

U.S. Applications:

[63] Continuation-in-part of Ser. No. 389,970, Aug. 20, 1973, and Ser. No. 389,783, Aug. 20, 1973, Pat. No. 3,898,453, each is a continuation-in-part of Ser. No. 62,380, Aug. 10, 1970, Pat. No. 3,755,678.

[51] Int. Cl.[2] ..... H01J 39/12

[52] U.S. Cl. ..... 250/211 J; 331/66; 357/12; 357/30

[58] Field of Search ..... 250/211 R, 211 J, 212, 250/552, 553; 331/66, 83, DIG. 1; 357/12, 13, 18, 29, 30; 324/79 R

[56] References Cited

U.S. PATENT DOCUMENTS

| | | | |
|---|---|---|---|
| 3,229,106 | 1/1966 | De Lord et al. | 250/211 J |
| 3,462,605 | 8/1969 | Engelei | 250/211 J |
| 3,649,838 | 3/1972 | Phelan, Jr. | 250/211 J |
| 3,755,678 | 8/1973 | Javan | 250/211 J |

FOREIGN PATENT DOCUMENTS 1,242,367 8/1971 United Kingdom.

OTHER PUBLICATIONS

Small et al., Applied Physics Letters, vol. 24, No. 6, 3/15/74, pp. 275–279.

Dees, The Microwave Journal, vol. 9, Sept. 1966, pp. 48–55.

Hocker et al., vol 12. No. 12, June 1968, pp. 401, 402.

*Primary Examiner*—David C. Nelms

*Attorney, Agent, or Firm*—Arthur A. Smith, Jr.; Martin M. Santa; John N. Williams

[57] ABSTRACT

Tunneling electronic devices responsive to infrared and far infrared radiation are formed by overlapping deposits which define ultra-thin dielectric layers (less than aout 10 Angstrom thickness) between metal layers, and contact areas of the order of 1 micron$^2$ or less. Preferred embodiments feature operation in the negative impedance region, particularly using multibarrier structures or operating at low temperature with both metals superconductors, and incorporation of the same in oscillators and multivibrators. Other embodiments feature two or more such devices in the form of triodes having positive feedback achieved by radiative or inductive coupling using integrally deposited line structures as the respective antennas or inductors. Similar deposited antennas, e.g. dipole antennas, are employed to produce radiative outputs from the devices achieving, e.g. tunable sources of radiation in the far infrared or infrared. The junctions are integrated with thin film structures designed to introduce capacitance as well as inductance components for appropriate impedance as parts of lumped circuit elements at far IR and IR frequencies. These enable tank circuits to be formed resonating in these regions. Loop constructions are also shown in which selected overlapped regions are sized to form tunneling junctions and other overlapped regions are sized or otherwise constructed to avoid non-linear effects. A frequency dividing network is shown enabling infrared or far infrared frequencies to be subdivided by a series of coupled oscillators constructed as above. Nonlinearities of the junction and production of reactive components in the junction, i.e. for impedance matching purposes, as with the antennas, are achieved by appropriate selection of the input frequencies relative to quantized modes of the dielectric layer. By appropriate selection, the variety of equivalent circuits can be achieved appropriate to such matching. Addition of selected impurities to the dielectric layer can serve to introduce the quantized modes in the far IR and IR and to enhance the scattering effects upon the AC signal in these regions.

34 Claims, 19 Drawing Figures

FIG 6
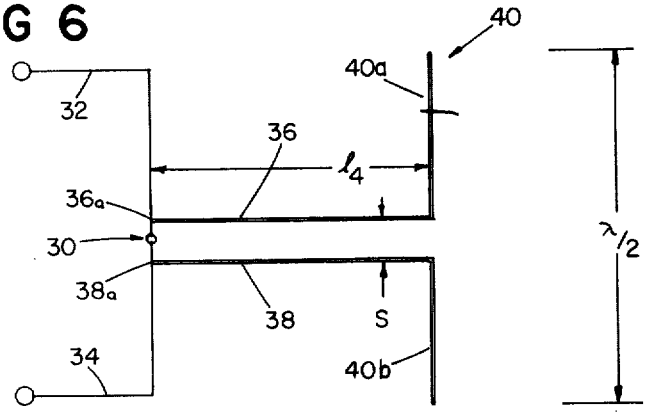
FIG 6a
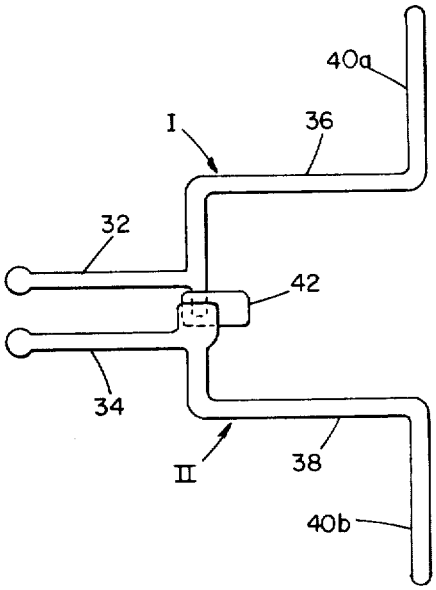
FIG 7
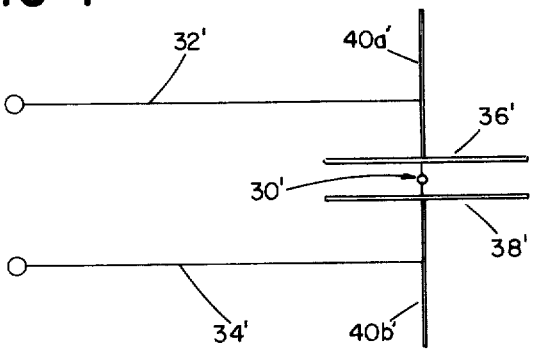
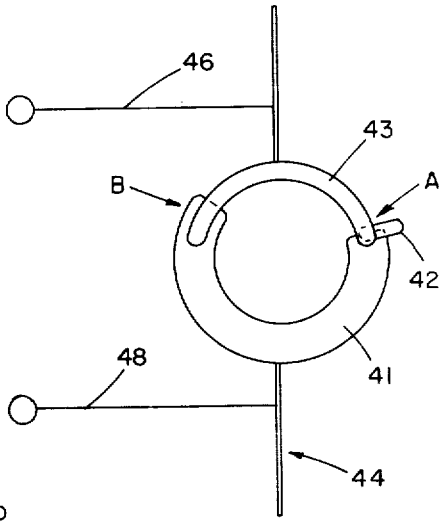
FIG 8
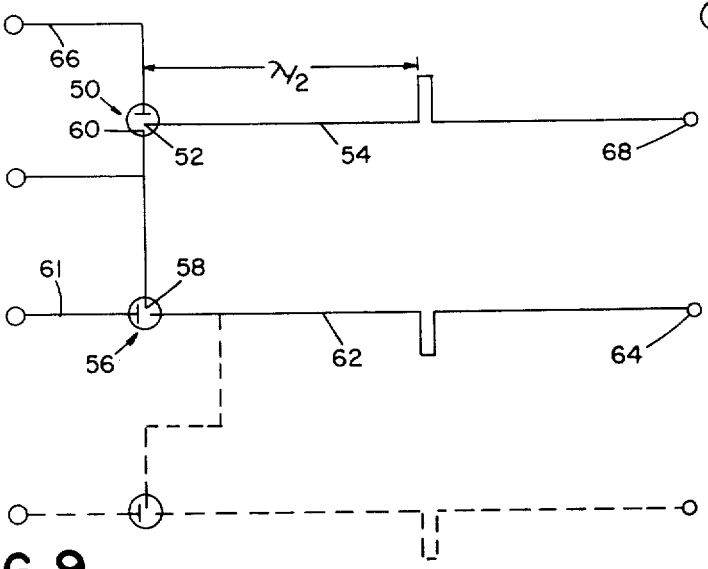
FIG 9

ELECTRON TUNNELING DEVICE

Matter enclosed in heavy brackets [ ] appears in the original patent but forms no part of this reissue specification; matter printed in italics indicates the additions made by reissue.

The invention herein described was made in the course of work performed under Contact No. F19628-7-C-0150 with the Electronics Systems Division of the Department of the Air Force and under Contract No. N00014-67-A-0204-0014 with the Office of Naval Research, Department of the Navy.

This application is a continuation in part of my copending applications entitled Generating and Using Coherent Optical Radiation, Ser. No. 389,970 filed Aug. 20, 1973 and Solid State Optical Junction Devices and Arrays and Systems Incorporating Same, Ser. No. 389,783, filed Aug. 20, 1973, now U.S. Pat. No. 3,898,453, which in turn are continuations in part of my prior application Ser. No. 62,380 filed Aug. 10, 1970, now U.S. Pat. No. 3,755,678. The disclosures thereof are all thereby incorporated by reference.

This invention relates to devices capable of oscillation, radiation, amplification, frequency subdivision and other functions at the far infrared and adjacent regions of the frequency spectrum. In this invention quantum mechanical electron tunneling is employed in a metal-dielectric-metal deposit upon a solid substrate. The deposit comprises ultra thin dielectric films and microscopic contact areas, and is integrated with other components of the device, including inductance and feedback antenna arrangements.

As noted by L. F. Saki in "Long Journey into Tunnelling," Science, Mar. 22, 1974, p. 1149, et seq, the tunneling phenomenon in metal-dielectric-metal contracts per se was demonstrated in 1930, and since that time has been the subject of extensive research. Also, as noted in that article and articles by I Giaever in "Electron Tunneling and Superconductivity," Science, Mar. 29, 1974, p. 1253, et seq, and Davis and Hasack in "Double Barrier in Thin Film Triodes," Journal of Applied Physics, Apr. 1963 p. 864, et seq, such contacts have been known to produce a negative resistance characteristic, meaning amplifiers, oscillators, and other devices, and have been known also to be useful to form triodes, etc.

In prior work the dielectric barrier has been of 30 Angstrom or usually considerably greater thickness and typical contact areas have been of the order of one square millimeter. The relatively large capacitance of such contacts, the rapid increase in impedance when one decreases contact area for reducing capacitance, and the problems of non-uniformity in deposited layers have seemingly limited the practical speed of response of such tunneling contacts to frequencies much lower than those of concern here.

According to the present invention it has been discovered to be possible to obtain a true response over a broad range extending into the far infrared and infrared regions employing solid deposits having contact areas of the order of 1 square micron (1 million times smaller than the above example), with dielectric thicknesses of less than about 10 Angstrom (less than 5 atoms thickness). Significantly it is found that the ultra-thin dielectric layer between the metal deposits successfully resists breakdown under the applied voltage and current densities and has contact impedance at the most of a few hundred ohms (impedance so low that in a larger contact it might be considered a metallic short). (For actual tests see the paper authored by my colleagues and myself: Small, Elchinger, Javan, Sanchez, Bachner and Symthe, Applied Physics Letters Vol. 24, No. 6, Mar. 15, 1974, P. 275 et seq., the disclosure of which is hereby incorporated by reference.)

Within the parameters of construction described above, tunneling is obtained, with response at freqencies of the order of $10^{12}$ Hz and higher, with contact capacitance of the order of $10^{-12}$ farad or indeed $10^{-14}$ or lower. While a full explanation of these results is not yet available, it is probable that a number of compensating factors have, fortuitously, and in combination, allowed these results to be obtained. Thus, although prediction of non-uniformities in deposit thicknesses of about 10A has discouraged experiments, it has been now realized that the drastically reduced contact area of the present device reduces the probability of non-uniformity effects; and while reduction in contact area per se would greatly increase impedance, the reduction in barrier thickness more than compensates, while the enlarged current densities do not lead to failure perhaps because of increased cooling effects attributable to the increase of surface to volume ratio attendant with the reduction in size.

Further, according to the invention, devices including oscillators, radiation sources, amplifiers, multivibrators and frequency subdividers are constructed incorporating metal-dielectric-metal deposited contact regions within the parameters just noted. Preferably there are realized in the form of multibarrier structures, i.e. structures having two or more layers of dielectric separated by appropriate metal layers in a series arrangement or by operating with the metals of the junction in superconductive state.

In certain embodiments the contact exhibits a negative impedance characteristic, means are provided to bias the contact into the negative impedance region, and the contact is connected in parallel with an inductance to define an integrated tank circuit with resonant frequency in the desired region. According to one preferred embodiment the RC time constant of the circuit is as fast as the speed of response of the contact and oscillations take place in the form of CW. In another embodiment where the speed of response of the contact is not matched to the RC time constant of the circuit, a relaxation oscillator is achieved, its oscillation appearing in the form of pulses. In either embodiment avantageously a means to alter the bias over the negative impedance curve is provided to enable the frequency of oscillation to be pulled, thus to achieve a tunable oscillator at far infrared or adjacent frequencies.

In preferred embodiments an antenna structure is deposited on the substrate matched to the frequency of oscillation, for emitting radiation at that frequency. According to one preferred embodiment, a contact having a negative impedance characteristic is connected across a pair of parallel conductors deposited upon the substrate, of length related to the oscillation wave length, to provide the inductance of the tank circuit, the outer ends of these lines being connected to an antenna structure, preferably each line connected to one branch of a dipole antenna. According to another preferred embodiment, a loop is formed by multiple deposits which also, in a region of juncture, form the effective contact, extensions of the deposits forming an antenna.

In a device according to another preferred embodiment, a multiple barrier structure is provided in which an intermediate metal layer forms in effect a control grid or base, its voltage controlling the current flowing from one side to the other of the structure.

In another embodiment two or more such devices are provided with the collector of the first connected to the control or base of the second. By adding a deposited antenna optically coupling the collector of the second device with the control or base of the second, a feedback oscillator operable in the far infrared region or adjacent frequencies is achieved. In similar arrangements monostable and bistable multivibrators are achievable.

In still another embodiment a series of oscillator structures is provided of progressively lower resonating frequency, employed to subdivide the frequency e.g. of a laser, to a lower frequency, at which it may be radiated or conducted through a transmission line. In other embodiments selection of input frequencies relative to local quantized modes of the dielectric barrier are employed to enhance nonlinearities or to introduce nonlinear reactive components.

These and numerous other objects and features of the invention will be understood from the following detailed description of certain embodiments taken in conjunction with the drawings wherein:

FIG. 6 is a plan view of a negative impedance oscillator incorporating an active device according to the invention; and FIG. 6a illustrates details of fabrication thereof;

FIGS. 7 and 8 are plan views of alternative embodiments to that of FIG. 6;

FIG. 9 is a plan view of an oscillator employing triodes and antennas providing feedback in accordance with the invention.

In the presently preferred form a multibarrier device is manufactured in accordance with generally known microelectronic methods, and presented with other structure in a predetermined array, such as described below. For devices operable in the far infrared and infrared region, the techniques of Photolithography e.g. as described in Smith, Bachner and Efremow, Journal of Electrochemical Society; Electrochemical Technology, May 1971, Vol. 118, No. 5 are applicable, in which deposited lines to an accuracy of less than 1 micron are realizable. Alternatively, and of particular utility for shorter wave lengths, one may employ the methods of electron beam microfabrication such as are described in "Microcircuits by Electron Beam," Broers and Hatzaki; Scientific American, November, 1972.

The ultrathin dielectric layer employed in the device according to the invention may be obtained by choosing metal which has an inherently thin oxide layer (e.g. nickel) or by employing metals usually having thicker oxide layers, limiting the amount of oxygen to which the metal is exposed and then by applying additional layers of metal and dielectric to seal the contact area from further exposure to oxygen. Other dielectric substances may be employed too.

Figure 1:
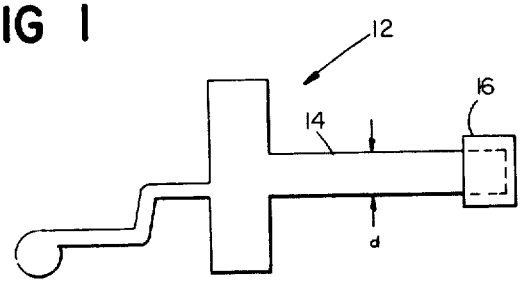
FIG. 1 is a plan view illustrating initial steps in fabricating a device according to the invention.
Figure 4A:
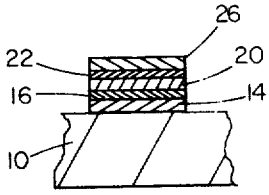
FIG. 4a is a diagram of the resulting multibarrier junction.
Figure 2:
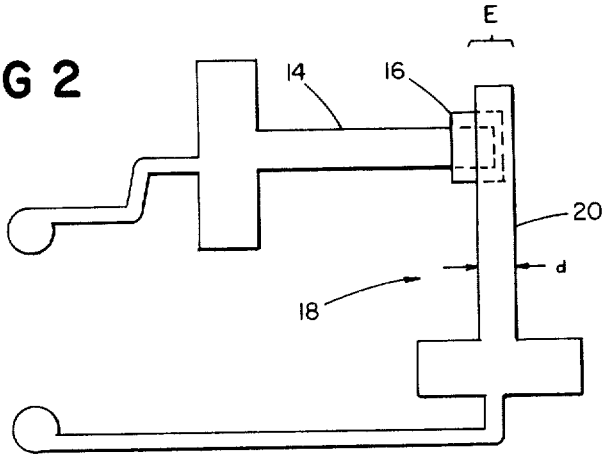
FIG. 2 shows a diode device according to the invention.
Figure 3:
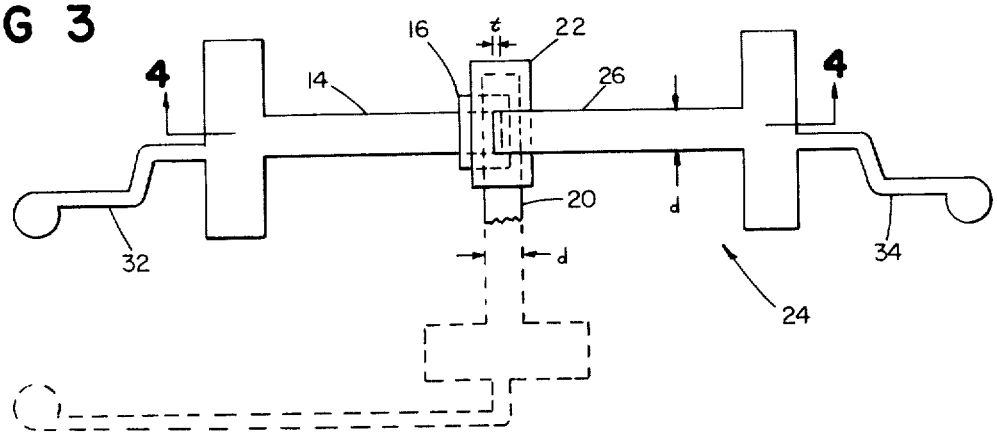
FIG. 3 shows a multibarrier diode according to the invention, which with addition of dotted portions becomes a triode device.
Figure 4:
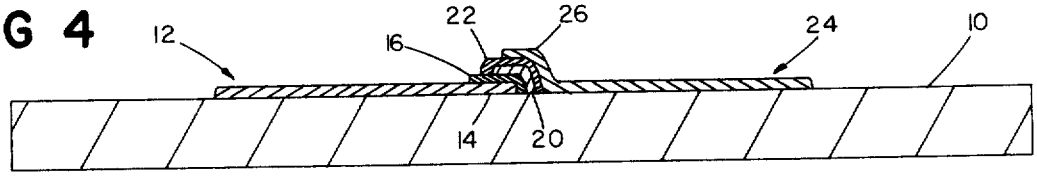
FIG. 4 is a cross-sectional view taken on line 4—4 of FIG. 3.

Referring to FIGS. 1 and 4 the first step in forming a device according to the invention is to deposit upon a non-conductive substrate 10 (preferably transparent to the radiation of interest, e.g. silicon, aluminum oxide or sapphire for infrared radiation) a conductive line structure 12 including leg 14 of an appropriate first metal, e.g. copper, nickel or aluminum. The leg 14 has a width d of the order of 1 micron and a controlled thickness of less than 1 micron. The metal of this line structure or at least the tip of leg 14 for the contact region is then allowed to oxidize (or is coated) to form what will become a potential barrier, a dielectric layer 16 of a few Angstrom (less than about 1 nm) thickness. Referring to FIG. 2 in the next step a second conductive line structure 18 with leg 20 similar to leg 14 but at right angles to it, of a second metal which may be the same or different from the first is deposited on the substrate, with width d and a controlled thickness less than 1 micron and slightly overlapping in region E the top of leg 14, a distance kept small, preferably less than about 1 micron. The metal of this second leg 20 is then provided with a dielectric layer 22 as above. Then, referring to FIG. 3, a third conductive line structure 24 of a third metal is deposited with leg 26 similar to leg 14, aligned with it and pointed in the opposite direction. It slightly overlaps the top of leg 20 in region E, a distance t, also kept small, preferably less than 1 micron.

The particular metals and oxides or other dielectric are chosen with their work functions and similar characteristics in mind, as well as the mode and conditions of proposed operation. Thus where it is desired to have a nickel and chromium sandwich, with oxide dielectric, it is preferable to deposit the nickel first and allow it to oxidize, as it oxidizes more gradually than chromium, offering better opportunity to control the oxide to obtain the ultra thin oxide layer. Similarly, where the device is intended to provide a negative impedance phenomenon in accordance with super lattice theory, not only should the various thicknesses, including the intermediate metal thickness, be properly designed and controlled to ensure conservation of energy and momentum, but also the substances should be selected with a view to proper reflectivities, as explained in the literature. Where it is desired to have both or only one side of the device superconductive appropriate choice of metals is again dictated, to employ metals which are superconductive at the chosen temperature of operation.

Under certain circumstances even a diode formed in accordance with FIG. 2 will produce an I-V characteristic having a region of negative slope, i.e. negative resistance, which can lead to negative resistance oscillators. One mechanism through which this can occur is by operating at low temperature with both metals superconducting, see the tunneling articles cited above. Another mechanism for achieving negative impedance is by utilization of multi-barrier structures, i.e. structures in which there are two or more dielectric layers separated by a metal layer of predetermined thickness. FIG. 4 can be taken as a representation of such a multi-barrier construction, see also FIG. 4a.

The multi-barrier structure, constructed in accordance with appropriate parameters, can produce a negative impedance region in accordance with multi-layer tunneling barrier phenomena of the super lattice, as explained by Tsu and Esaki, Applied Physics Letters, Vol. 22, No. 11, June 1, 1973, p. 562. In FIG. 3 of that article the I-V curve for the double and triple barriers is given, in which regions of negative impedance are clearly seen.

Multi-layer devices within the general paramaters given above, i.e. contact areas of less than about 1 micron$^2$ and barrier thicknesses less than about 10 Angstrom, can achieve the desired high-speed response while demonstrating the negative impedance characteristic just mentioned. According to the invention, such a structure is integrated with deposits forming a tank circuit, thus to provide a negative impedance oscillator.

Figure 5:
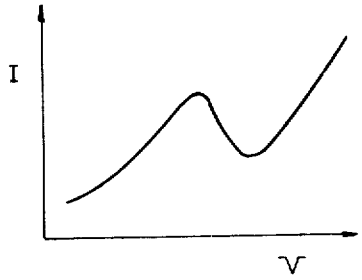
FIG. 5 is a current-voltage curve (I vs V) illustrating a negative impedance region of active devices employed in certain embodiments.

FIG. 5 denotes the current-voltage characteristic curve of such a device, and FIG. 6 represents the incorporation of such a device into an oscillator.

In FIG. 6, a multi-barrier diode 30 of the metal-dielectric-metal type (as illustrated in FIG. 3) is constructed in accordance with the foregoing parameters, having a region of negative slope in its current-voltage characteristic and provided with leads 32 and 34 for connection to a voltage source to bias the junction into the negative conductance region. The junction typically has between its legs 14, 26 a capacitance of the order of $10^{-12}$ to $10^{-14}$ farad, the smaller values being advantageous for higher frequency operation. A pair of parallel electrically conductive line structues 36 and 38 is deposited upon the substrate to form an inductive element, the ends 36a and 38a being connected to respective sides of the junction. The length of these line structures is approximately a quarter wavelength of the frequency of interest taking into consideration the fact that the wavelength for the integrated structure upon the substrate will be less than the free space wavelength of the same frequency. In the embodiment illustrated in FIG. 6, these line structures are each less than about 2 microns in width and thickness, and the selected spacing S between them is about 5 microns. The inductance of the tank circuit is determined in accordance with well known theory by the length of the structures 36, 38 which is selected with regard to the frequency that will be used in the device.

The right-hand ends of the parallel line structures 36 and 38 are connected to the inner ends of dipole antenna 40, each branch 40a, 40b of this antenna extending at a right angle to its respective line structure and the overall length of the dipole being approximately a half wavelength of the operating frequency. For an example the length of the parallel lines 36 and 38 may be 10 or 20 or 50 microns (and each branch of the dipole antenna the same length) depending upon the frequncy at which resonance is desired. The capacitance for the thus formed tank circuit is provided dominantly by the junction 30, but also in part by the parallel line structures 36, 38; the inductance of the circuit is dominated by the properly spaced parallel lines; the resistance is dominated by the radiation resistance of the antenna, and the more detailed design considerations readily follow from known work in negative resistance oscillators, tailoring the oscillator expressions to the very small size and the very small capacitance and inductance present, and being careful to take into consideration effects that the leads 32, 34 may have at very high frequency.

Alternative structures will be evident to those skilled in the art as illustrated in FIG. 7 wherein elements identified with primed numerals have functions corresponding to those with unprimed numerals in FIG. 6.

In operation, a DC voltage is applied across pads 32 and 34, sending a current through the tunneling contact 30 and driving the tunneling contact with the negative impedance region. Then this system will oscillate at a frequency determined by the circuit as a whole. The antenna will radiate at the resonant frequency, thus providing a source, for instance, of far infrared of a frequency determined by the particular dimensions chosen in depositing the structure. Also, by changing the bias between the contact pads 32 and 34, it is possible to change from one portion to another of the negative impedance region of the current-voltage curve of the active device, thus to pull the frequency. Using this technique it is possible to achieve a tunable range of about 10 percent of the frequency.

FIG. 6a illustrates how the oscillator of FIG. 6 may be advantageously fabricated by first depositing integral metallic structure I defining the first metal layer of the active device, first lead 32, inductance line 36 and the upper branch 40a of the dipole antenna, then after oxidizing, depositing a controlled thickness metal layer 42, and after again oxidizing, depositing a second line structure II defining the third metal layer of the active device, the second lead 34, line 38 and the lower branch 40b of the antenna. It may be noted that only three deposits and two oxidation steps are required for the construction of the complete oscillator.

Typically a contact area of 1 micron$^2$ may be assumed with a metal-to-metal separation at each dielectric layer on the order of the atomic dimension, that is, less than about 10 Angstrom. The inductance L provided dominantly by the parallel line structure is of the order of $3 \times 10^{-12}$ Henry and the capacitance C is equal to $10^{-14}$ or $10^{-15}$ farad, contributed dominantly by the junction. Accordingly the frequency f is given by:

$$f = 1/(2\pi\sqrt{LC}) = 10^{12}\,\text{Hz}$$

The dipole antenna 40,/is then constructed with overall length $\lambda/2$ of 100 microns suitably corrected to take into account the change in wavelength due to the presence of the substrate upon which the antenna is deposited.

As shown in FIG. 8 it is also possible to deposit an integrated structure with an active device in a loop where the inductance would appear essentially from the loop. Referring to FIG. 8, a first metal deposit 41 of e.g., 20 micron length and curved to form half of an inductance loop is vacuum deposited on the substrate and then allowed to oxidize to provide a dielectric layer thereupon. Then intermediate layer 42 is deposited at A and oxidized. Subsequently, a second half loop 43 of metal of line width and thickness of about $2\mu$ is deposited with ends overlapping the ends of the half loop 41 at A and at B. The overlap in the area A is sized to produce a multi-barrier junction with a contact area of 1 micron$^2$ or less in accordance with the principles outlined above. The area of overlap B at the opposite ends of the loop however is sized much larger and therefore is effectively shorted by its own capacitance at the frequencies of interest. (Or area B may be protected from oxidation effects and an ohmic contact formed.) Thus there is provided a tank circuit with the inductances of the loop appearing in parallel with the capacitance of the junction. Dipole antenna 44 and biasing leads 46, 48, may be provided by the same operations employed to form the diode as described in connection with FIG. 6a. In this structure the single loop defines the inductance of the tank circuit and again the tiny contact establishes the capacitance, it being remembered that the very small separation of the metal layers of the active device, on the order of the atomic dimension, 5 or 10 Angstrom, makes the capacitance of the contact dominant. Typical dimensions and parameters for this construction are readily calculated from well known theory for any desired operating frequency in accordance with the principles discussed above.

One application of devices according to the invention is as a source of far infrared or infrared radiation, tunable by varying the bias voltage on the contact and thus shifting the point of operation along the I-V curve in the negative impedance region. Thus it can be seen that in a way a new laser is formed for generating radiation; and it is possible to incorporate the device in a Fabre Perot resonator to achieve a more intense radiation level or to employ a phased array of the devices to achieve a similar effect.

The oscillator is particularly useful in spectroscopy and in atomic clocks for the purpose of up-conversion or in other instances for the purpose of down-conversion, discussed below.

Multi-barrier active devices such as those described above are also useful to provide amplification and feedback controlled circuits. In such cases the intermediate metal layer is extended as shown in dotted lines in FIG. 3. The intermediate metal acts as a control element along the line of the theoretical consideration given by Davis and Hosack in "Double Barrier in Thin-Film Triodes", Journal of Applied Physics, Apr. 1963, p. 864, et seq. and references there cited, to which reference is made. Feedback from one portion of a device to another may be accomplished by radiative coupling through antennas deposited as integrated structures with the active devices as illustrated in FIG. 9 where two multi-layer active devices are deposited upon a substrate. The first device 50 has its intermediate metal layer 52 connected to an $\lambda/2$ antenna leg 54 and the second device 56 has its intermediate metal layer 58 connected to the emitter 60 of the first device. Also the collector of the second device is connected to an $\lambda/2$ antenna leg 62. The two antenna legs are parallel and spaced in accordance with known antenna theory to enable positive feedback which thus supports resonance in the selected frequency region. As with other such oscillators the system has a band through which it can be tuned by varying the bias across the devices by means of bias pads 61, 64, 66, and 68.

Additional elements may be added to obtain more complex circuits as indicated in FIG. 9 where in dotted lines a third ultra-thin dielectric layer triode is indicated, controlled by the second, and with antenna coupled to the second for positive feedback. Thus a phased array of three or more active devices can be achieved, all coupled for positive feedback, and their antennas also radiating to the outside world at the resonant frequency.

It is further apparent that by appropriately adjusting antenna separation negative feedback can be achieved and by appropriate changes in the printed circuitry and with reference to the extensive literature on circuit theory, both monostable and bistable multi-vibrators can be achieved, with obvious application as signal sources and storage components in computers and other logic networks operable at speeds greatly increased over those heretofore known.

Negative impedance diode oscillator or a triode configuration used as a multivibrator or as a flip-flop circuit element can be used to subdivide frequencies. This can be done in accordance with principles well known at radio frequencies. See Principles and Applications of Electron Devices, Paul D. Ankrum, international Text Book Company. In such devices the frequency of oscillation can become synchronized by an external signal. An applied voltage of a frequency higher than the free-running oscillation frequency of the system can cause it to lock at the frequency of the synchronizing signal or it can become locked at a subharmonic frequency of it. Accordingly the invention described here enables subdividing frequencies starting from far infrared or infrared frequencies. Possible applications of this principle include high frequency counter applications.

Figure 10:
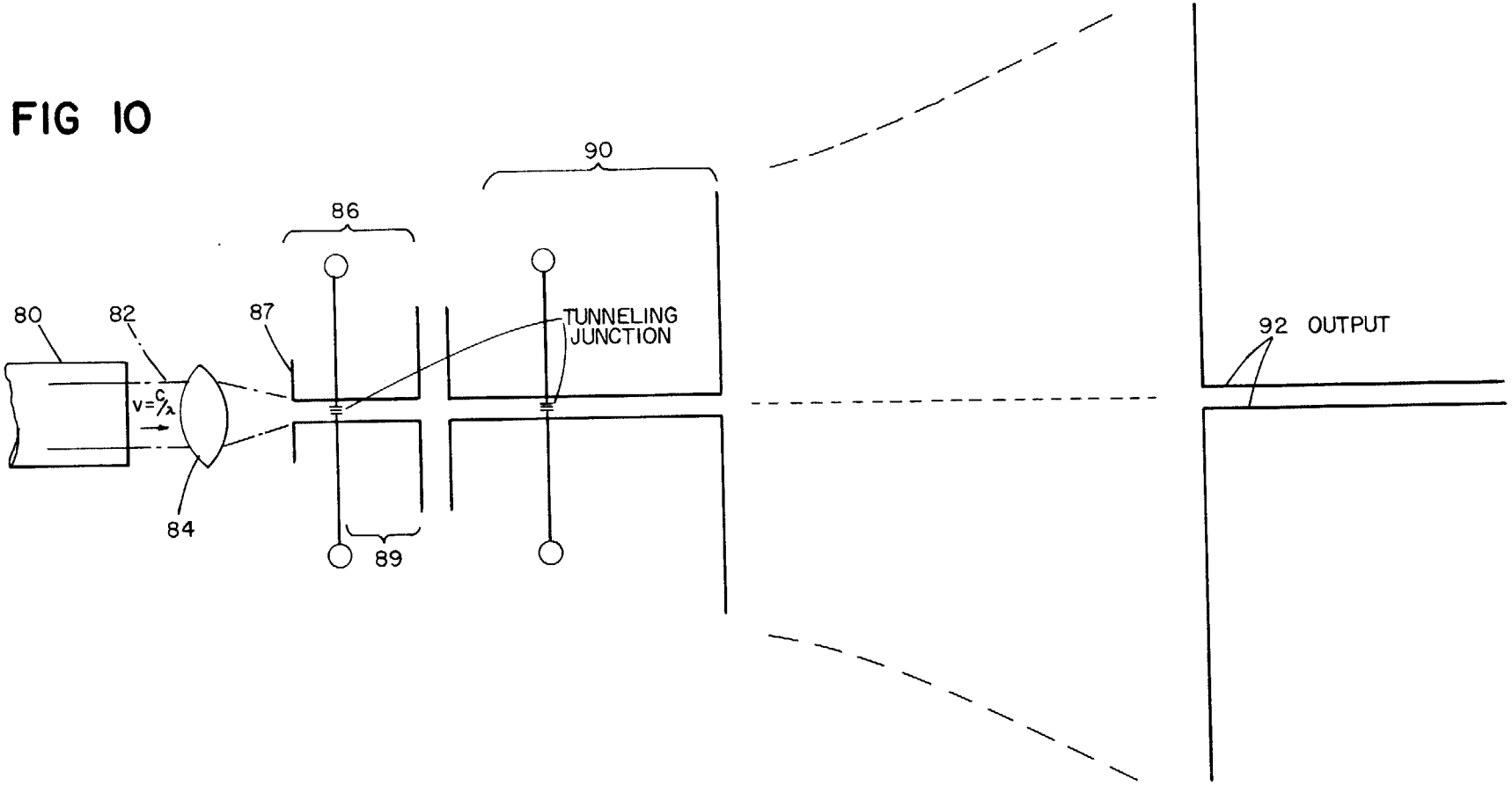
FIG. 10 is a diagrammatic view of a frequency divider network employing a series of negative impedance oscillators, responsive to input from a laser.

Referring now to FIG. 10 a laser 80 applies a radiation input 82 of infrared wave length $\lambda$ through lense 84 to a first negative impedance oscillator structure 86 which has an antenna input structure 87 resonant to $\lambda$. The same oscillator structure 86 also has an output structure 89 resonating at $2\lambda$. The radiation input through lens 84 at frequency $V = c/\lambda$ will trigger the oscillator 86 to oscillate at frequency $V_1 = C/(2\lambda)$ which in turn, through its output, is coupled to a second stage 90 of similar construction but designed to oscillate at frequency $V_2 = c/(4\lambda)$. As indicated by the dots, further stages subdivide the frequencies in additional steps. The output can be coupled out for instance by a parallel pair of lines 92 forming a transmission line. More elaborate oscillator designs utilizing diodes as well as triode configurations can be utilized in accordance to the principles well known in the radio frequency regions, see for instance the Ankrum reference cited above, and thus multivibrators or flip-flop elements can be achieved.

Reference is made now to the aspect of the invention concerning enhancement of nonlinearities in the active devices and introduction of nonlinear reactive components as desired by appropriate relation of the operating frequencies to the quantized modes. In a diode structure, it is known that tunneling electrons can be scattered from local quantized modes of the dielectric barrier. This effect has been frequently observed in large area tunneling junctions which are not capable of responding at high frequencies. In these cases, the effect appears as changes in the DC I-V characteristic curve whose onsets occur at fairly well-defined values of bias voltages. These voltages correspond to the quantized energies of the vibrational modes associated with specific molecular bonds in the dielectric barrier (see J. Lambe and R. C. Jakleivic, Phys. Rev. 165,821 (1968). Employing the present invention, tunneling junctions can be made with a capability of operating at very high alternating frequencies and according to a further feature of the invention the input frequencies are then chosen to be in the regions where the local quantized modes of the dielectric barrier lie. In these regions resonant scattering of alternating currents from the local modes will result in dispersive effects causing a phase-shift to appear between alternating current and the applied voltage. This will in turn introduce inductive or capacitive components in the tunneling impedance. These reactive effects will be nonlinear functions of the applied voltages. According to this effect, a diode junction when used at frequencies close to the resonances of its local quantized modes, will show enhanced nonlinearities. Beyond this according to the invention, in these regions, the nonlinear capacitive or inductive effects can be used to match the junctions to the antenna structure integrated to it.

Similar dispersive effects are also expected in multibarrier structures (super lattice); i.e. the non-linearities of tunneling impedance, the resistive as well as the reactive components of impedance, are enhanced in the regions where tunneling electrons resonate with the multibarrier structure.

Figure 11:
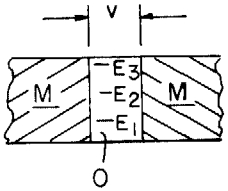
FIG. 11 is a diagram illustrating the local quantized modes of the dielectric barrier of devices according to the invention in relation to a far infrared or infrared input.

Referring now to FIG. 11, a printed diode metal-to-metal junction is shown where the letters M denote the two metal components and 0 the intervening dielectric layer. The levels $E_1$, $E_2$, $E_3$, denote quantized energies of the local modes. The voltage V applied across the dielectric layer 0 is $V = V_0 + v \cos \omega t$ (where $V_0$ is the biasing voltage and v the applied radiation field) and a current flows $I = I_0 + i \cos (\omega t + \phi)$ where i is is the amplitude of the alternating current and $\phi$ is the phase shift.

Figure 12D:
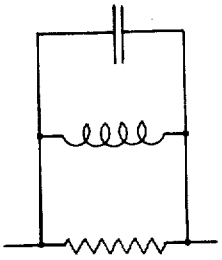
FIGS. 12a, b, c and d illustrate equivalent circuits achievable from appropriate selection of the variables of the device of FIG. 11.
Figure 12C:
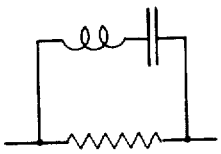
Figure 12B:
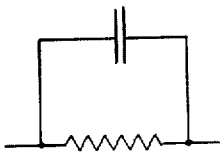
Figure 12A:
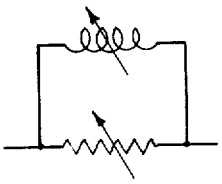

Depending upon the relationship of the frequency of the voltage applied across the metal-to-metal diode structure a phase shift, $\phi$, occurs between the applied voltage V and the resultant current I. This results in the reactive components, as mentioned before and, depending upon the particular relationship of the frequency with respect to the exact resonances any of the equivalent circuits of FIGS. 12a, 12b, 12c and 12d can be realized. The variability of the resistive and inductive components indicated in FIG. 12a can be controlled by varying the biasing field $V_0$ as well as the applied radiation yield v.

The effects here described can be introduced or enhanced by utilizing impurities in the dielectric layer as it is being deposited. The impurities can be for instance $H_2O$, or $D_2O$ or organic molecules such as methyl aclohol, etc. Different impurities will give different energy spacings.

Figure 13:
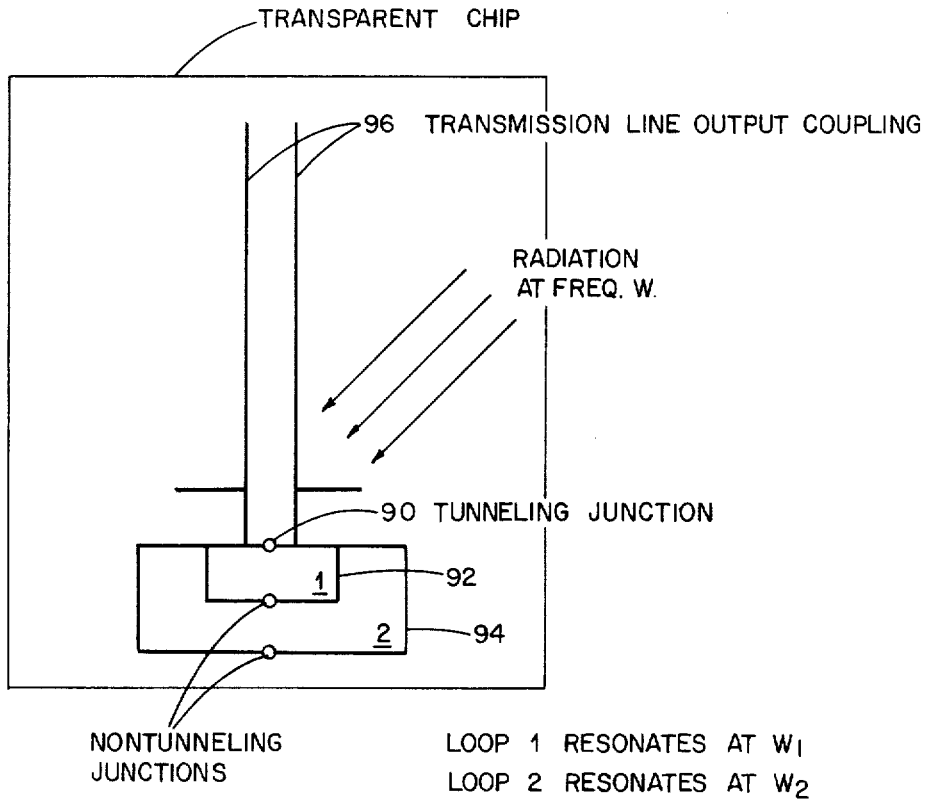
FIG. 13 is a diagram of a parametric frequency down conversion unit.
Figure 13A:
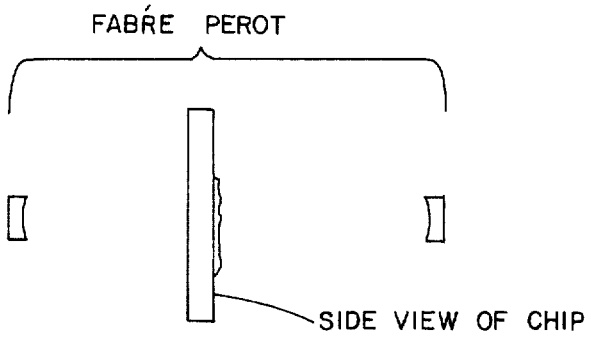
FIG. 13a is an illustration of the invention employing a fabre-Perot resonator.

Advantages of nonlinear reactive effects in parametric frequency conversion and frequency mixing are well-known from previous knowledge in the radio and microwave frequency work. All of these previous considerations are applicable to the invention described here. For instance in frequency down conversion, nonlinear reactive effects will not be limited in efficiency by the Manly Row relation and hence can be more efficient as compared to applicaton of resistive nonlinear effects. Referring to FIG. 13, an example of parametric frequency down conversion is to drive the nonlinear junction 90 (constructed according to the techniques described above) at a frequency $\omega$. By introducing resonant tank circuits 92 and 94 by the thin film techniques already mentioned, these circuits being resonant at frequencies $\omega_1$ and $\omega_2$, such that $\omega_1 + \omega_2 = \omega$, oscillation will then occur at $\omega_1$ and $\omega_2$ if the amplitude of the driving voltage at $\omega$ is sufficiently large. The outputs at $\omega_1$ and $\omega_2$ are then taken along the transmission line output coupling 96. The nonlinear reactive components employed in this embodiment can be obtained by, e.g., two local quantized modes, one of them having an energy spacing in the vicinity of h $\omega_1$ and the other in the vicinity of h $\omega_2$ where h is the Plank Constant. In addition to a tank-circuit, external Fabre Perot resonators can be used to enhance the Qs at the appropriate frequencies as suggested in FIG. 13a.

By limiting the junction contact area to about 1 micron$^2$ and the dielectric thickness to less than 10 Angstrom, the devices according to the invention can be operated at frequencies in the submillimeter and far infrared region, and at even higher frequencies if precise manufacturing techniques such as X-ray or electron beam lithography are used to achieve very small dimensions.

Operation of the active devices in a negative impedance oscillator (whether in CW or as a relaxation oscillator) or in feedback arrangements, can in certain instances be enhanced by cryogenic cooling.

It will be understood that while a major aspect of the invention relates to the achievement of active devices, especially oscillators and vibrators operable in the far infrared and infrared regions, the discoveries, particularly with reference to the performance of ultra-thin dielectric layers and small areas of the printed structures, as well as the associated printed antenna, will lead in certain instances to application to adjoining frequency regions, both higher and lower.

What is claimed is:

1. An electronic device comprising a substrate and thereon first and second metallic overlapping deposits with a dielectric layer therebetween forming a metal-dielectric-metal type junction having a contact area of the order of 1 micron$^2$ or less and the dielectric layer thickness being less than about 10 Angstrom, said junction being conductive through quantum mechanical tunneling effects and having a non-linear current-voltage response characteristic [.], *said first and second deposits having integral non-overlapping portions extending away from a region of overlapping to provide means for direct connection of other circuit elements to said junction and enabling effective coupling to other circuit elements at impedance levels not more than a few hundred ohms and at operating frequencies of $10^{12}$Hz and higher.*

2. The device of claim 1, the current-voltage response curve of said device having a negative impedance region, and including connections integrally formed with said first and second layers for biasing said device into said negative impedance region.

3. A device as claimed in claim 1 including an intermediate metallic layer between said first and second metallic layers and separated therefrom by dielectric layers.

4. A device as claimed in claim 1 including on said substrate a linear inductor structure connected to and deposited integrally with at least one of said metallic layers forming said junction.

5. A device as claimed in claim 4 said inductor element and said junction connected to form an oscillator.

6. The oscillator of claim 5 including on said substrate a metal deposit connected to and deposited integrally with at least one of said junction forming layers providing a radiating antenna, an antenna responsive to oscillations in said oscillator.

7. The oscillator of claim 5 wherein said inductor is defined by parallel metal line structures deposited upon said substrate, different line structures connected to different sides of said contact.

8. The oscillator of claim 6 wherein each side of said contact is connected to a portion of an antenna structure.

9. The structure of claim 7 including a deposited dipole antenna structure, the branches thereof extending at right angles to said parallel metal line structures.

10. The oscillator of claim 9 wherein one end of each of said parallel line structures is connected to a respective side of said junction and the other end is connected to the inner end of a branch of said dipole antenna.

11. The oscillator of claim 7 wherein the connection between each of said line structures to the respective side of said contact is made at a mid-portion of said line structure and the inner end of a branch of a dipole antenna is connected to and extends outwardly from the mid-portion of each of said line structures.

12. The oscillator of claim 5 including a first linear structure integrally deposited with said first metallic layer of said junction, and junction being at an end thereof, and a second linear structure deposited integrally with said second metallic layer of said junction, said junction being at an end thereof, the ends of said first and second structures remote from said junction overlapping and effectively shorted at the operating frequencies of the oscillator, the said first and second structures forming a loop providing inductance for said oscillator.

13. The oscillator of claim 12 wherein said remote ends of said line structures which overlap form an ohmic contact.

14. The oscillator of claim 12 wherein said other ends of said line structure which overlap are separated by a dielectric layer, the area of said overlap being substantially greater than 1 micron$^2$.

15. The oscillator of claim 10 wherein opposite sides of said loop are connected to the inner ends of respective branches of a dipole antenna formed by metal line structures deposited on said substrate.

16. The oscillator of claim 5 wherein said device comprises at least two layers of dielectric separated by a metal layer, said negative impedance region established by a multi-barrier response characteristic.

17. The device of claim 1 including a linear antenna structure connected to and integrally deposited with at least one of said metallic junction layers.

18. Two devices as claimed in claim 17, the antenna structures of the respective devices positioned to provide feedback between said devices.

19. The apparatus of claim 18 wherein each of said devices includes a pair of dielectric layers separated by a metal layer which serves as a control of the conductance of said device, the control of said first device connected to a metal deposit forming a receiving antenna, the collector of said first device connected to the control of the second said device, and the collector of the second device connected to a metal deposit forming a transmitting antenna, said receiving and transmitting antenna arranged in coupling relation to provide positive feedback from the second to the first device to maintain oscillation.

20. A multi-vibrator incorporating the device of claim 1 as the active element.

21. An electronic device incorporating a plurality of active devices as claimed in claim 1 with a feedback arrangement wherein said active devices comprise a series of deposits on a substrate having nonlinear current voltage characteristics in the far infrared region, each of said deposits being integrated with an antenna structure printed upon said substrate, said antenna structures disposed in coupling relation to each other, and related to their respective active devices to transmit a feedback signal between said devices.

22. The device of claim 21 wherein said antennas are constructed and arranged for positive feedback.

23. An oscillator for producing radiation of wavelength $\lambda$ incorporationg the device of claim 22 wherein said antennas are of a length $\lambda/2$ or $3\lambda/2$.

24. The oscillator of claim 23 wherein three or more of said devices are arranged in a phased array for coupled operation.

25. An electronic device comprising a substrate and thereon first and second metallic overlapping deposits with a dielectric layer therebetween forming a metal-dielectric-metal type junction having a contact area of the order of 1 micron$^2$ or less and the dielectric layer thickness being less than about 10 Angstrom, said junction being conductive through quantum mechanical tunneling effects and having a non-linear current-voltage response characteristic, said dielectric layer having local quantized modes and means applying to such junction an alternating field of frequency in the region of the energy band between local quantized modes thereby to produce a response dependent upon the interaction of said applied field and said local quantized modes.

26. The electronic device of claim 25 having a response to infrared radiation and said means applying a field of infrared frequency to said dielectric layer.

27. The electronic device of claim 25 having a response to far infrared radiation and said means applying a field of far infrared frequency to said dielectric layer.

28. The electronic device of claim 25 said alternating field and said quantized modes cooperatively selected to produce enhanced nonlinear response of said junction to applied AC fields.

29. The electronic device of claim 25 in combination with an antenna, said alternating field and said quantized modes cooperatively selected to produce a reactive component tending to match the impedance of the junction to said antenna.

30. An electronic frequency conversion device comprising a series of junctions each comprising first and second metallic overlapping deposits on a substrate with a dielectric layer therebetween forming a metal-dielectric-metal type junction having contact area of the order of 1 micron$^2$ or less and the dielectric layer thickness less than about 10 Angstrom, each said junction conductive through quantum mechanical tunneling effects and having a non-linear current-voltage response characteristic, each of said junctions associated with other components forming an oscillator, the resonant frequencies of the resultant series of oscillators progressively varying through the series in accordance with multiples of a given wave length, means for coupling said oscillators together and means for coupling into a first said oscillator an applied radiation field input of wave length related to said given wave length such that frequency is converted by the progressive interaction of said series of oscillations.

31. The device of claim 30 wherein said applied field is of infrared or far infrared frequency.

32. The device of claim 30 wherein junctions in said series have input and output structures mutually related throughout said series, the input structure of a given oscillator being resonant at the resonant frequency of the output structure of the immediately adjacent oscillator, and the output structure of the given oscillator having a resonant frequency different by a factor of two from the resonant frequency of the input structure of the same oscillator.

33. The device of claim 32 wherein each oscillator comprises a dipole input antenna and a dipole output antenna, the respective junction connected between the branches thereof.

*34. A plurality of devices as claimed in claim 1 deposited on a single substrate, there being predetermined direct interconnections between said devices formed by metallic deposits to provide electronic circuitry operable at impedance levels not more than a few hundred ohms and at frequencies of $10^{12}$Hz and higher.*

* * * * *